United States Patent [19]

Inbar

[11] Patent Number: 4,574,234

[45] Date of Patent: Mar. 4, 1986

[54] SYSTEM FOR MEASURING SELECTED PARAMETERS OF ELECTRICAL SIGNALS AND METHOD

[75] Inventor: Michael Inbar, Santa Barbara, Calif.

[73] Assignee: Applied Magnetics Corporation, Goleta, Calif.

[21] Appl. No.: 654,809

[22] Filed: Sep. 26, 1984

[51] Int. Cl.[4] .................. G01R 15/12; G01R 23/12
[52] U.S. Cl. ............................. 324/73 R; 360/67; 324/77 R
[58] Field of Search ............. 371/21; 324/77 E, 77 D, 324/78 F, 78 D, 77 A, 73 R, 57, 112, 113; 375/10; 328/150; 360/67, 6; 340/196.2; 364/481, 483

[56] References Cited

U.S. PATENT DOCUMENTS

| | | | |
|---|---|---|---|
| 3,230,461 | 1/1966 | Dix et al. | 324/77 D |
| 4,004,230 | 1/1977 | Campbell | 324/77 R |
| 4,192,451 | 3/1980 | Swerling et al. | 324/73 R X |
| 4,306,194 | 12/1981 | Chapman | 328/150 |
| 4,308,501 | 12/1981 | Tuccinardi et al. | 328/150 |
| 4,410,970 | 10/1983 | Law | 324/77 D X |
| 4,507,740 | 3/1985 | Star et al. | 324/77 R X |

FOREIGN PATENT DOCUMENTS 0678692  8/1979  U.S.S.R. ..................... 375/10

Primary Examiner—Raymond F. Cardillo, Jr.
Assistant Examiner—Alyssa H. Bowler
Attorney, Agent, or Firm—Daniel J. Meaney, Jr.

[57] ABSTRACT

An electrical measuring system for measuring selected parameters of electrical signals derived from magnetic recording and having a frequency within a known frequency range wherein the system includes an input stage having an automatic amplifier for selectively amplifying the electrical signals to a preselected amplitude level, a first circuit which includes a digital peak detecting circuit for producing digital signals representing peak amplitude and the amplitude of the electrical signals sampled at closely spaced intervals and wherein the digital peak detecting circuit includes circuitry for sampling the preselected amplitude level electrical signals at a frequency which is less than the frequency of the electrical signals, a second circuit which includes a first phase-locked loop circuit, a frequency dividing circuit and a second phase-locked loop circuit for producing an output signal representing the frequency of a remnant signal in the electrical signals which is applied to the digital peak detecting circuit for producing a digital signal representing the remnant signal magnitude, a third and fourth stage for producing direct current voltage signals representing the power magnitude of noise spectra and the DC content of a pulse train for deriving from the pulse widths of the electrical signals, respectively, and for applying the same to the digital peak detecting circuit to produce a digital representation thereof is shown. A method for processing electrical signals to produce digital representations of the amplitude, read-over-write ratio, signal-to-noise ratio and the average pulse widths thereof is shown.

17 Claims, 10 Drawing Figures

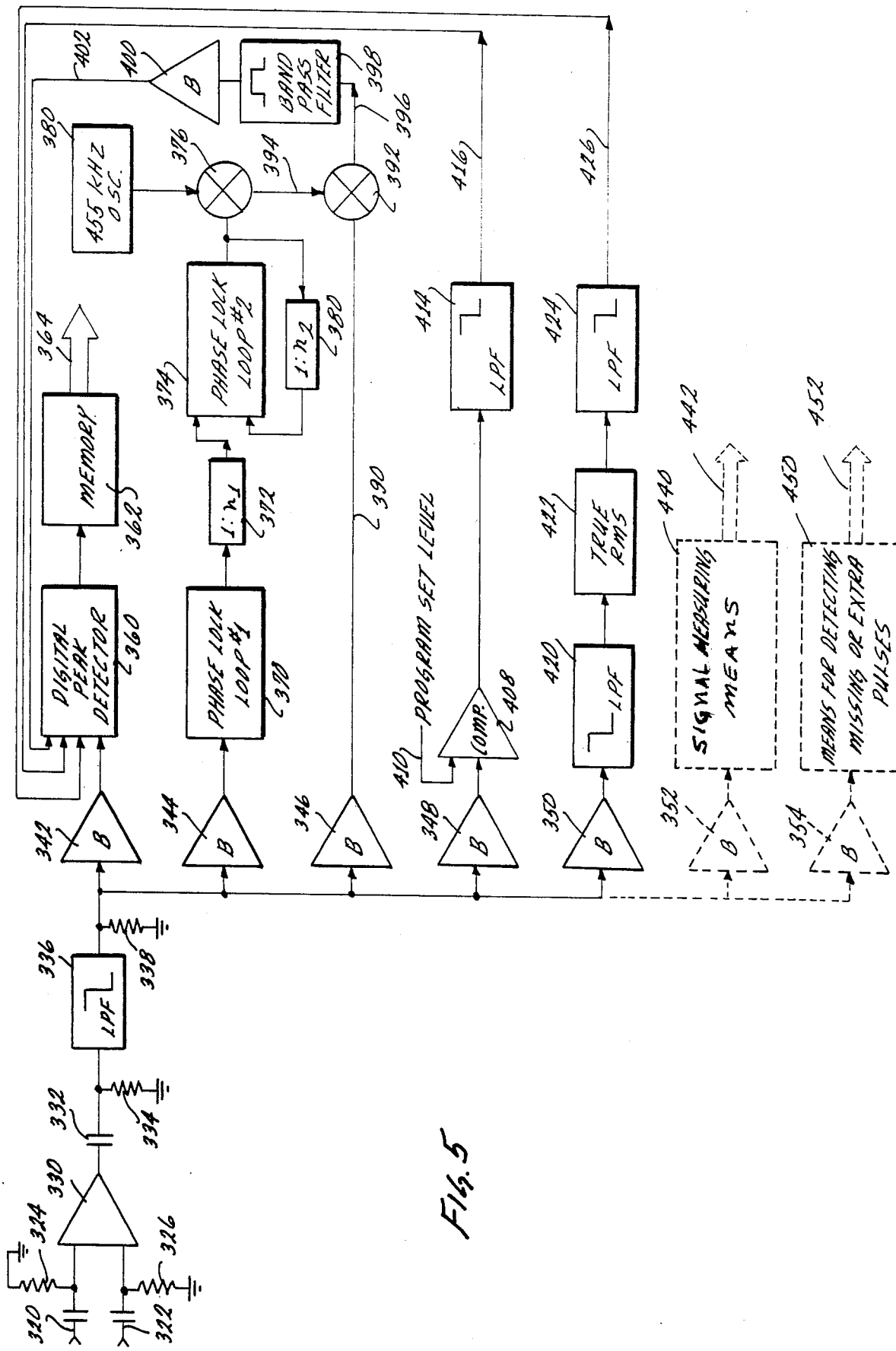

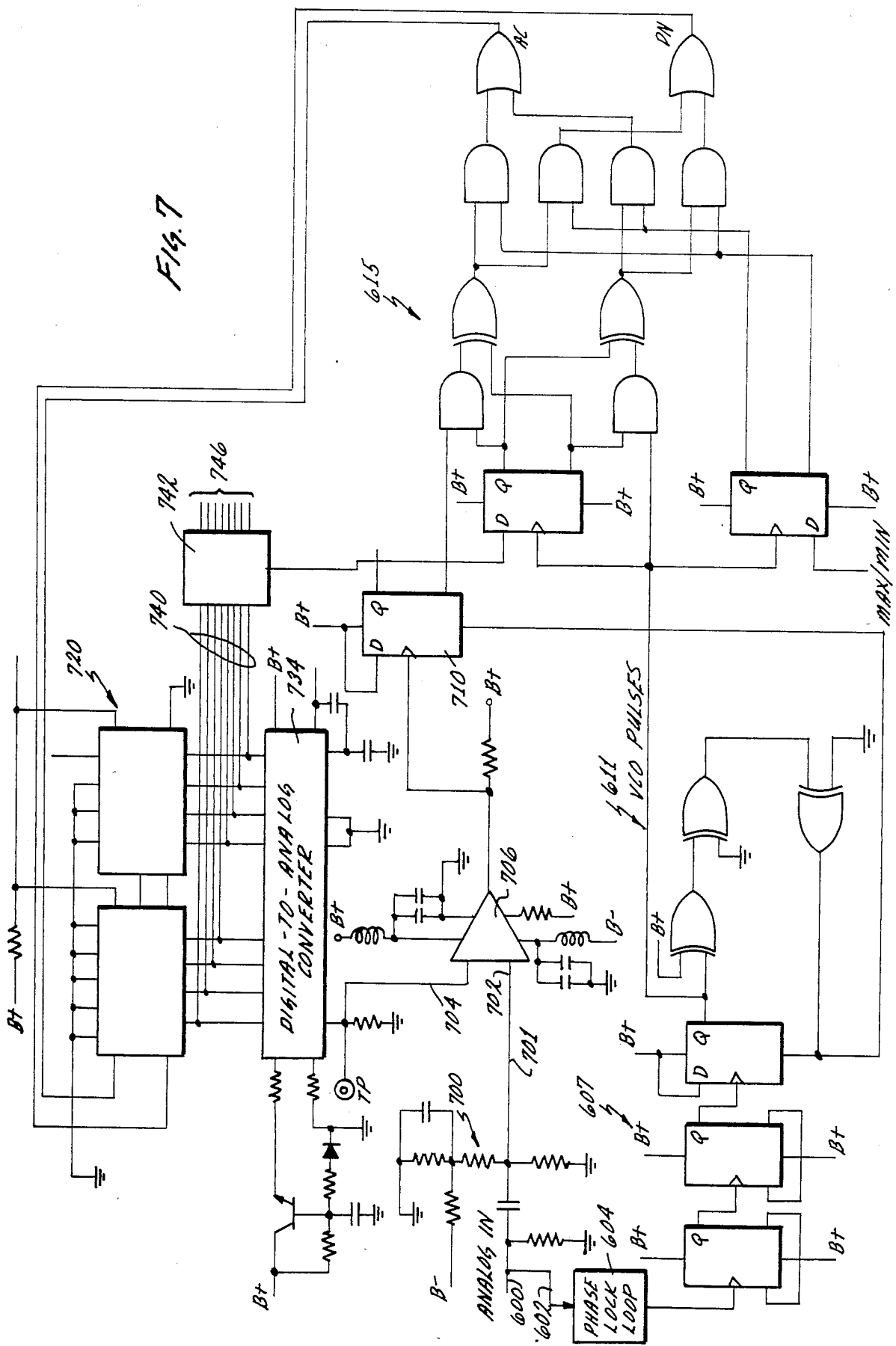

SYSTEM FOR MEASURING SELECTED PARAMETERS OF ELECTRICAL SIGNALS AND METHOD

BACKGROUND OF THE INVENTION

1. Field of the Invention

This invention relates to a system and method for measuring selected parameters of electrical signals having a frequency within a predetermined band of frequencies wherein the electrical signals are derived by relative movement between magnetic transducers and a magnetic medium having prerecorded data thereon and more specifically relates to a system and method for measuring the amplitude, overwrite signal amplitude, noise level amplitude and pulse width of the electrical signals and for producing, as an output from the system, digital representations thereof in the form of a multibit digital output signal capable of being processed by a computer or other digital processing circuits to produce output information therefrom relating to the amplitude, read-over-write ratio, signal-to-noise ratio and average pulse widths of the electrical signals.

2. Description of the Prior Art

It is known in the prior art to utilize apparatus, equipment and systems for measuring selected parameters of electrical signals derived from magnetic recording. One such known system is offered for sale and sold by Applied Magnetics Corporation and is known as the Model HTU-280 Magnetic Head Tester for Thin-Film Heads. In the Model HTU-280 thin film head tester, the apparatus includes means for measuring the peak average amplitude and the pulse widths of the electrical signals utilizing analog signal processing circuitry. The processing rates are at relatively low frequencies in the order of 100 to 200 hertz. The peak average amplitude detectors are responsive to the electrical signals which have a relatively high frequency relative to the processing frequency of the measuring circuitry and the detectors measure changes or variations in the envelope of the electrical signals rather than the individual amplitude or pulse width of a signal.

Circuits for measuring the pulse width of electrical signals are well known in the art. Typical of such pulse width measuring systems is a system offered for sale by Hewlett-Packard Corporation, identified as Model 300 Pulse Counter. The Model 300 Pulse Counter measures pulse widths utilizing means for converting the pulse into a square wave at a fast clocking rate and counting the pulses with a high-speed counter.

It is also known in the art to use systems and apparatus for developing the "read-over-write" characteristics of a magnetic head in recording and reproducing prerecorded magnetic data from a magnetic medium. The read-over-write measuring technique involves writing a signal onto the magnetic disc with a magnetic head at a predetermined frequency and then erasing the recorded frequency by recording a second signal at a different higher frequency on the same portion of the magnetic disc. The read-over-write measurement comprises a ratio of the amplitude of the previously recorded signal at a first frequency to the amplitude of the presently recorded signal at a second frequency, which frequency is preferably at a higher frequency. The ratio between the two signals is referred to as the read-over-write ratio. Typical frequencies utilized in the IBM Model 3370 technology for making the read-over-write measurement are a low-frequency signal, in the order of 1.8 megahertz, as the first signal and a high-frequency signal, in the order of 4.8 megahertz, as the second signal. In the IBM Model 3380 type system, the low-frequency signals are in the order of 3.0 megahertz, and the high-frequency signals are in the order of 8.0 megahertz.

Another known device for measuring the frequency and other characteristics of electrical signals derived from magnetic recording is Model SLM telemetering apparatus which is offered for sale and sold by Hewlett-Packard Corporation. The Model SLM telemetering apparatus operates at a fixed frequency and does not track minute changes in frequency versus variation of disc rotation. The Model SLM telemetering apparatus detects the signal-to-noise ratio and uses a true RMS signal for purposes of detecting the signal-to-noise ratio.

Typically, most prior art measuring devices include analog peak detectors and analog-to-digital converters in order to generate a digital representation of the amplitude for input to a computer or other digital device.

It is also known in the art to utilize a number of recording schemes or formats for recording electrical signals. Typically, the recorded signal outputs from a magnetic head in a magnetic recording and reproducing apparatus have a frequency in the order of 1 to 10 megahertz or higher. The electrical signals derived from the magnetic recording may be modulated by any conventionally used modulation codes, such as multiple frequency modulation ("MFM"), biphase coding, limited run length codes, or any other coding system such as phase modulation or the like. The system and apparatus of the present invention are able to measure the selected parameters of the electrical signals independent of the recording format.

SUMMARY OF THE PRESENT INVENTION

The present invention relates to an electrical system for measuring selected parameters of electrical signals having a frequency within a known frequency band, wherein the electrical signals are derived from relative movement between magnetic transducers and a magnetic medium having prerecorded data thereon. The typical selected parameters which are measured by the system of the present invention includes producing digital representations of the signal amplitude, read-over-write ratio, signal-to-noise ratio and the average pulse width of the received electrical signals. In the preferred embodiment, the system includes input means which includes an automatic amplifying means for receiving the electrical signals and for selectively amplifying the electrical signals to a preselected amplitude level. The system includes a digital peak detecting means for producing a digital representation of analog signals applied thereto.

The system includes a first means which is operatively coupled to the input means for receiving and applying the preselected amplitude level electrical signals to a digital peak detecting means for producing a digital representation of the peak amplitude of the preselected amplitude electrical signals.

The system includes a second means which is operatively coupled to the input means for receiving the preselected amplitude level electrical signals. The second means includes means for sampling at closely spaced intervals the instantaneous amplitude of the preselected amplitude level signals and for producing an output signal representative of the sampled instantaneous amplitude and for applying the same to a digital peak detecting means. The sampling means includes means for establishing the frequency at which the preselected amplitude level electrical signals are sampled at a frequency which is less than the frequency of the electrical signals.

The system further includes a third means which is operatively coupled to the input means for receiving the preselected amplitude level electrical signals. The third means includes a first phase-locked loop means which is adapted to derive from the input electrical signals the frequency thereof. The third means further includes a frequency dividing means and a second phase-locked loop means which are operatively coupled to the first phase-locked loop means such that the output of the first phase-locked loop means is applied to the frequency dividing means. The output of the frequency dividing means is applied as an input to the second phase-locked loop means for determining the frequency of a remnant signal having a known frequency which is an integer division or multiple of the second frequency. The remnant signal is present in the preselected amplitude level electrical signals. The third means is reposive to the second phase-locked loop to produce an overwrite signal representing the magnitude of the amplitude of the remnant signal. The third means includes means for applying the overwrite signal as an input to the digital peak detecting means for producing a digital output signal representative of the overwrite signal.

The system further includes a fourth means, which is operatively coupled to the input means, for receiving the preselected amplitude level electrical signals. The fourth means includes means for determining the power of the noise spectra signals within a preselected band of frequencies of electrical signals and for producing a direct current voltage signal representative of the noise power in the RMS sense. The direct current voltage signal produced by the fourth means is applied to the digital peak detecting means for producing a digital representation of the power of the noise spectra.

The system includes a fifth means, which is operatively coupled to the input means, for receiving the preselected amplitude level electrical signals. The fifth means includes a programmable comparator wherein the reference voltage level thereof is capable of being programmed to a specific reference voltage level of a plurality of preset reference voltage levels. The voltage reference levels are automatically adjusted to represent a fixed percentage of the total input signal amplitude. The programmable comparator is responsive to the preselected amplitude level electrical signals and to a specific reference voltage level of the plurality of preset reference voltage levels to produce an output pulse from the programmed comparator having a known amplitude determined by the specific reference voltage level. The output pulse has a pulse width which is determined by the width of the preselected amplitude level electrical signals at the known amplitude of the specific reference voltage level and is operative to produce a train of known amplitude pulses having a known period and a variable pulse width. The variable pulse width of each pulse is determined by the width of the preselected amplitude level electrical signals at the amplitude of the specific reference voltage level. The fifth means includes means for applying the train of pulses to a low-pass filter to produce an integrated voltage signal representative of the direct current content of the train of pulses and for applying the integrated voltage signal to the digital peak detecting means to produce a digital representation of the average pulse widths.

The digital peak detecting means is responsive to the signals applied thereto from the first means, the second means, the third means, the fourth means and the fifth means to produce a plurality of digital output signals representative of at least one of the amplitude of the electrical signals, the amplitude of the remnant signal, which is part of the electrical signals, the magnitude of the power of the noise spectra signals and the average pulse widths of the electrical signals produced by relative movement between the magnetic transducers and the magnetic medium having prerecorded data thereon.

The known prior art electronic measuring systems and apparatus are capable of producing electrical output signals which are representative of the selected parameters of the electrical signals derived from magnetic recording. However, each of the known measuring systems, apparatus and methods utilize low-frequency analog signal processing techniques to produce the output signals or, in the alternative, utilize extremely expensive high-frequency pulse counting circuitry for generating information which is representative of the desired selected parameters of the electrical signals.

The known measuring systems further utilize independent components, such as analog-to-digital converters, in operative relationship with analog signal processing means to produce a digital signal representative of the amplitude of the electrical signals. In the prior art, the signal-to-noise ratio is developed by circuitry which utilizes analog signal processing techniques for producing a signal which is representative of the ratio, and the so-produced signal representative of the ratio is then applied to an analog-to-digital converter to produce a digital representation thereof.

In the prior art, the read-over-write ratio is obtained by means of an asynchronous fixed frequency detection system. Thus, the bandwidth of the filter used to produce the remnant signal component has to be wide enough to accommodate variations of the frequency of the electrical signals including variations of frequencies $\Delta f_{rm}$ produced by mechanical variations of the rotating mechanism. Generally, the wider the bandwidth of the filter, the greater is the degradations of the detected and passed signal. This limitation is of major significance in measuring the amplitude of remnant signals in electrical signals produced in magnetic recordings.

An attempt has been made to limit the fixed frequency problem by use of a heterodyne testing process. However, the $\Delta f_{rm}$ introduced mechanically into the electrical signals by the variations in rotating speed of the rotating mechanism have not been eliminated and the selected bandwidth for the filter must be of sufficient width to accommodate the $\Delta f_{rm}$ component which still results in significant degradations of the measured signal. In the heterodyne testing process, a synthesizer generates a known frequency $f_k$ which is mixed with the electrical signals having a frequency which lies within a known frequency bandwidth. The output is a variable frequency having a remnant signal at a frequency $f_r$ frequency modulated by $\Delta f_{rm}$ introduced by the rotating mechanism. Thus, the filter must have a sufficiently wide bandwidth to pass the frequency of the reproduced signal $\pm \Delta f_{rm}$. Likewise, in electronic measuring devices which utilize high-speed pulse counting techniques wherein the pulse width of the electrical signals is generated using high-frequency pulse counting techniques, the pulse counting circuitry required to measure the electrical signals is costly and produces output signals which are representative of pulse counts which can be converted into pulse width measurements. In such circuitry, the pulse width representation can be digitized and produced as a separate output digital signal.

In the known prior art magnetic head/disc measuring systems, it is known to record the magnetic data in a preformed alternate pattern format which produces output signals which have discrete, spaced changes in the magnetic pattern from bit to bit. Such prerecorded patterns at high densities fail to include degrading effects imposed on the electrical signals, having a frequency within a known bandwidth, at the higher density levels. Signal degradation is introduced from a number of sources, such as intercell interference at high density, the nonuniformity or random recording of the patterns in actual recording and reproducing of data. All of the above effects are compounded at high density recording levels.

None of the known prior art electronic measuring devices, apparatus and systems teach, suggest or disclose combining all of the processes for measuring the selected parameters of electrical signals into a single system. In the electrical measuring system of the present invention, a digital representation of selected parameters of the electrical signals are produced and are processed digitally by means of a computer to generate such output data as: (1) the mean amplitude of the electrical signals including deviations thereof from a mean amplitude established for the electrical signals: (2) the read-over-write ratio using a synchronous automatically tracking technique; (3) signal-to-noise characteristic which is determined by the computer comparing the digital representation of measured noise signals to the digital representation of the measured amplitude of the electrical signals and for generating the signal-to-noise ratio; (4) the digital representation of the average pulse width of the pulses and for utilizing a computer to make a digital comparison of the actual digital representation of the average pulse width to predetermined standard pulse width data to develop output signals, or the like, which are representative of variations in the pulse width signals; (5) the reconstruction in the mean sense of the total pulse shape function and specifically the ability to measure changes in the read-back signal shape associated with data patterns; and (6) a capability for performing the reconstruction for a wide range of modulation schemes.

In the present invention, the process and apparatus for measuring the selected parameters of the electrical signals, including specifically the magnitude of the remnant signal and the signal envelope function, is synchronized compared to the asynchronous detection and measuring apparatus and system of the prior art. The synchronous detection is based on use of phaselocked loops to track the desired frequency which eliminates any changes in frequency $\Delta f_{rm}$ imposed on the electrical signals by variations of the rotating mechanism. Therefore, one advantage of the present invention is that frequency variations are eliminated for measurement purposes and the bandwidth of the band-pass filter can be reduced which, in turn, reduces the amount of signal degradation and results in a more accurate electrical signal measurement.

In addition to the above, the prior art electrical measuring systems have not determined the absence of pulses or presence of extra pulses in electrical signals derived from magnetic recordings, which determinations are an important parameter in measuring the accuracy of the recorded and reproduced signals. Known pulse counting techniques are unable to detect the absence of pulses or presence of pulses at high pulse counting rates.

Thus, another advantage of the present invention is that electrical signals generated from a magnetic transducing head during magnetic recording can be evaluated on line.

Another advantage of the present invention is that the electrical signals can be generated by using a variety of prerecorded patterns prerecorded on the magnetic medium of the disc which is in operative relationship with a magnetic transducer. Specifically, prerecorded data can be recorded which closely represents data recorded in actual usage of the disc and the electrical signals generated therefrom can be evaluated for certain selected parameters using the teachings of the present invention.

A yet further advantage of the present invention is that the pulse width of the electrical signals can be converted to an average DC signal. The DC signal can be measured within a very narrow bandwidth. This results in a highly accurate and low cost measurement system.

A yet further advantage of the present invention is that the electronic measuring apparatus, system and method are able to generate data which can digitally measure peak shifts, signal asymmetry, and the like, based upon data stored in or developed by the computer.

A still further advantage of the present invention is that each module making up the electronic processing apparatus is automatically calibrated by use of two calibration points, $X_1$ and $X_2$, in a manner such that the same are representative of the output of a calibration source.

A still further advantage of the present invention is that the systems is capable of utilizing an automatic two-point calibration method and utilizing the so-established calibration points for measuring purposes within the system.

A yet further advantage of the present invention is that the electrical measuring apparatus, system and method are able to digitally determine whether there are excess or missing pulses in the pulse train based on the digitized output by utilizing digital processing techniques.

A yet further advantage of the present invention is that the system automatically calibrates itself at a periodic, high-speed rate.

A still further advantage of the present invention is that the system automatically scales itself between measuring functions.

A still further advantage of the present invention is that the electrical measuring system is independently capable of operating based upon preset input settings without requiring further adjustments thereafter.

A still further advantage of the present invention is that no operator is required for resetting the system, for scaling the system, or for calibrating the system when the same is on line and in a production atmosphere due to the automatic scaling and calibrating capabilities of the system.

A further advantage of the present invention is that the analog signals within certain portions of the disc drive control and the disc drive servoloop can be evaluated and measured for certain selected parameters.

A yet further advantage of the present invention is that the electrical signals are digitized at a relatively early stage of the signal processing circuitry, and the digitized signals are processed by a digital computer so that a wide variety of parameters can be measured.

A yet further advantage of the present invention is that the electronic measuring system is responsive to the electrical signals having a frequency which is known to be within a band of frequencies to generate digital representations of the amplitude and the results thereof can be used by a computer to calculate deviations of the amplitude from a mean value.

Another advantage of the present invention is that the electrical signals can be processed to produce a digital representation of the remnant signal amplitude, which is known as an overwrite signal, is used by a computer to calculate various ratios such as the read-over-write ratio.

A yet further advantage of the present invention is that the electronic measuring apparatus, system and method have application to any type of electrical signal measurement wherein measurement of selected parameters is required and wherein the system has particular application in measuring electrical signals from thin-film heads, rotating disc memories utilizing the Winchester-type technology, and measuring analog signals utilized as servo control signals in the disc drive.

A yet further advantage of the present invention is that the electronic measuring apparatus, system and method can be utilized in testing magnetic heads, magnetic media, and the like, during production thereof and have particular application to measuring electronic characteristics of thin-film magnetic heads adapted for use for high-density rotating disc memories.

BRIEF DESCRIPTION OF THE DRAWINGS

The foregoing and other advantages and features of the present invention will become apparent from the following description of the preferred embodiment when it is considered together with the illustrations of the accompanying drawings which include the following figures therein:

FIG. 5 is a block schematic diagram illustrating the circuitry for each of the modules which comprise the independent means for measuring selected parameters illustrating the preferred embodiment of the present invention;

FIG 7 is a schematic electrical diagram of the preferred embodiment of a digital peak detecting means.

DESCRIPTION OF THE PREFERRED EMBODIMENT

Figure 1:
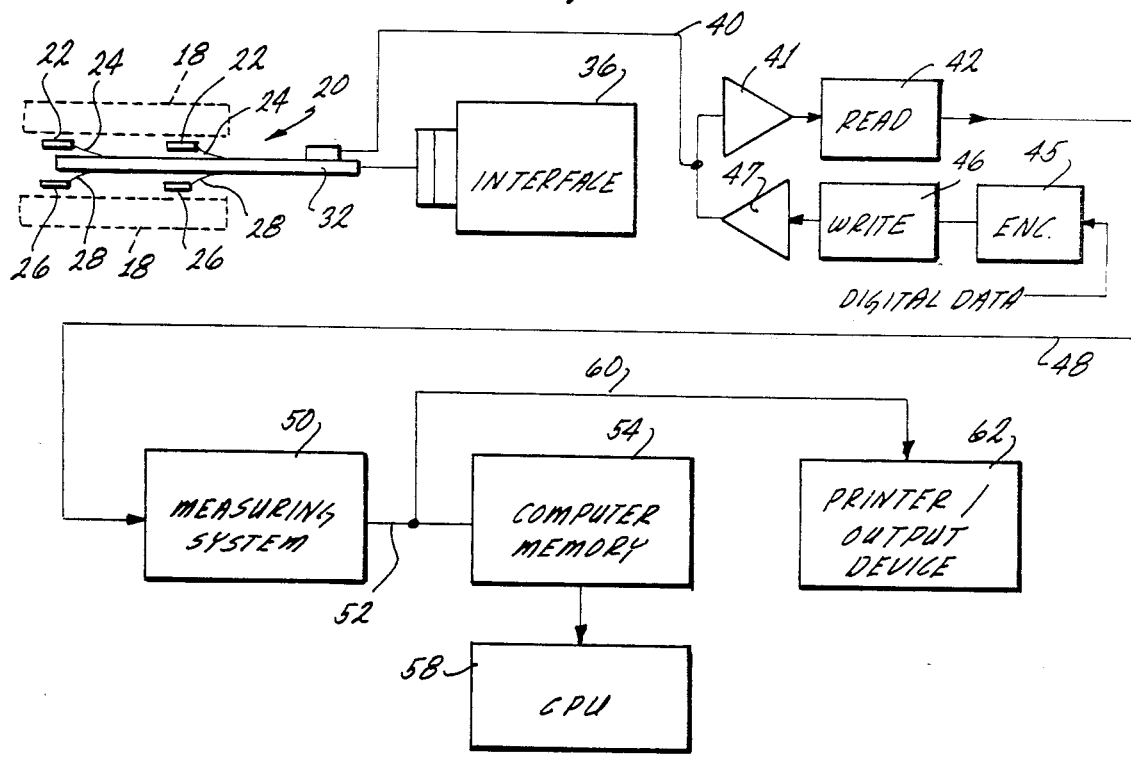
FIG. 1 is a block diagram and diagramatic representation of an electronic measuring system utilizing the teachings of the present invention for measuring electrical signals developed from a 3370-type magnetic head "tree" assembly.
Figure 6:
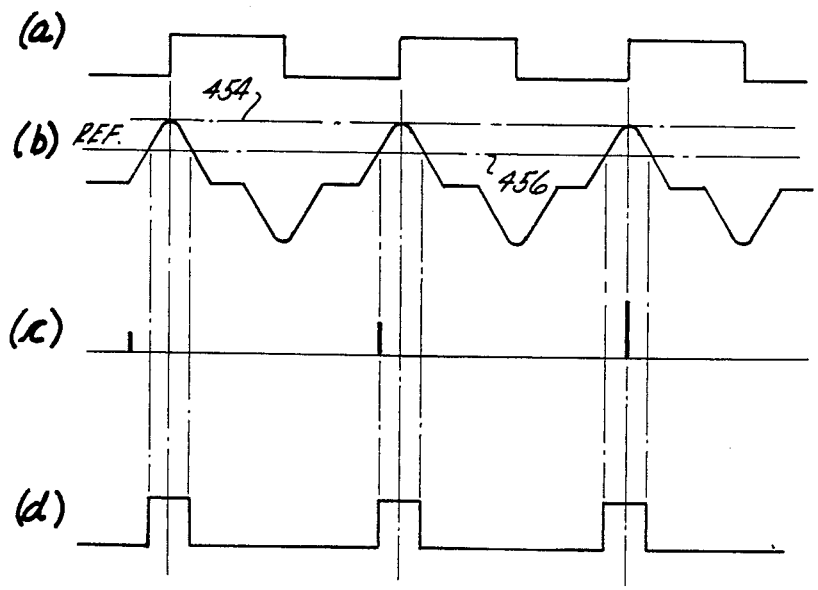
FIG. 6 (a)–(d) is a plurality of waveforms illustrating the waveforms for certain of the preprocessed electrical signals prior to applying the same to a digital peak detecting means for digitizing the same.

Before commencing a detailed description of the preferred embodiment, the following information is provided with respect to the overall system architecture and which will be helpful in understanding the detailed operations of the block and schematic diagrams of FIGS. 1 through 6, inclusive:

The concept involves generating electric signals of a known frequency from the relative movement between a magnetic transducer and a magnetic medium. Typically, with higher-density storage requirements it is becoming very desirable to utilize "hard" discs for storing data. In the so-called "hard" discs, the disc and magnetic head assembly utilizes the "Winchester-type" technology. In the Winchester-type technology, a magnetic head slider assembly is flown at a controlled altitude on a thin-film air bearing over the surface of a rotating disc having a selected magnetic medium on the surface thereof. In order to ensure that the magnetic transducers and/or magnetic medium and/or the electronics, servoloop control, and the like, are operating in a satisfactory manner, the characteristics thereof can be determined by measuring certain selected parameters of the electrical signals.

One of the inherent problems that is developed in utilizing rotating disc memories (and which is also involved in tape head/tape recording) is that the magnetic medium retains a "remnant" signal which is a portion of a prerecorded and erased signal that has not been completely removed during the later writing of another signal from the surface of the magnetic medium. Great effort is being made to improve the materials for and the magnetic medium affixed to the surface of a disc to reduce the tendency to retain prerecorded signals by utilizing such techniques as sputtering techiques for controlling the characteristics of the magnetic medium material. When a magnetic signal is recorded on the magnetic disc and that signal is ultimately erased by writing a new signal over it, there is still a small remnant signal remaining in the disc. This results in the same being reproduced as undesired information in a subsequent reading step. In addition in a rotating disc memory, variations in the rotation of the disc itself, which in certain of the rotating disc memories occur at a predetermined rotation rate such as at 3600 RMP, imposes a frequency modulation f into the overall recording scheme, that frequency being determined by the variation in speed of rotation from the desired speed of the rotating disc memory driving mechanism. The electrical effect of the mechanical variations of speed of the rotating memory is that the rotating memory mechanically imposes a frequency modulation on the overall electrical signals as the same are read onto and reproduced from the surface of a rotating magnetic medium through the magnetic transducing heads.

It is well known in the industry, in the production of thin-film magnetic heads or magnetic head slider assemblies, to test the magnetic head slider assemblies in a testing apparatus wherein a standardized, calibrated disc is used as a recording medium, and the disc has recorded thereon preprogrammed recorded data in a predetermined format which is particularly adapted for testing the magnetic heads. In magnetic head testing apparatus, it is necessary to removably load the magnetic heads to be tested onto a magnetic head tester and to conduct a series of preprogrammed tests on the electrical signals to certain selected parameters thereof.

In testing magnetic heads, the desired electrical parameters typically include the following:

(1) Average amplitude of the signals and deviations of the average amplitude of the signals from a preestablished mean value;
(2) a remnant signal (overwrite) which is developed from the prior recorded signals at a known frequency to measure the read-over-write ratio;
(3) The signal-to-noise ratio of the signals;
(4) The pulse width measurement of the pulses derived from the magnetic recording heads during the read operation;
(5) Peak shift and signal asymmetry of the reproduced electrical signals; and
(6) Extra or missing pulses from the pulse train which would be important to the accuracy of operation of the media.

Since the invention herein relates to measuring apparatus for testing electrical parameters of electrical signals at a frequency within a known frequency range and in order to ensure that consistency and accuracy is obtained, the system has been designed to provide for self-calibration utilizing a two-point calibration system. The calibration occurs in an automatic manner, and each main module is subjected to its own two-point calibration process such that the information derived within the module is based upon measurements which are made from automatically calibrated reference points to eliminate any discrepancy, error, or the like, in the system. This calibration is obtained by applying known signals having different known characteristics through the module to determine errors introduced into those signals by the module. By comparison of the measured error to the signal, the calibration error is developed for two points. All signals passing through the module are corrected by the known calibration error. Specifically, each main module contains a two-point automatic calibration source such that the module is calibrated at all times and each measurement of a parameter X can be deduced from the module output Y, which is represented by the following equation: (1) $Y = AX + B$, wherein the constants A and B are determined by having two points $x_1$ and $x_2$ be the output of the calibration source. The system is capable of measuring constants A and B from two known source points $x_1$ and $x_2$. By selecting $x_1$ and $x_2$, the constants A are B are known, fixed and calibrated. Therefore, equation (1) above essentially provides that when an output Y is received from a main module as indicated in equation (1) and since constants A and B are known, calibrated and set, the parameter X can be deduced from the module based on the above equation (1).

Thus, by constantly calibrating the main module and its reference points using a two-point calibration system, the parameter X can be deduced from the module based upon the output Y received from the module. The self-calibration is determined by a computer system such that when the computer receives a digitized representation of the output of a module, and since the computer is self-calibrating at any given operation point, the parameter X can be accurately calibrated.

In connection with the present invention, the electronic measuring system utilizes a first means which is operatively coupled to the input means for receiving and applying the preselected amplitude level electrical signals to a digital peak detecting means for producing a digital representation of the peak amplitude of the preselected amplitude level electrical signals. Also, the digital peak detecting means concurrently functions as a digital peak detector and digitizer for other modules. The other modules in the overall circuit have their output applied to the input of the digital peak detecting means wherein the input signals are digitized and applied as digital output signals to a memory, computer system, or the like, such that the processing of the digital information can be done in a digital format subject to the calibration provided by the computer.

However, the teaching hereof also discloses that the digital peak detector, the means for measuring the peak amplitude of the electrical signals, and the sampling of the amplitude of the electrical signals at closely spaced intervals can be separate means or circuits.

Referring to FIG. 1 of the drawings, the preferred embodiment of the present invention is an electrical measuring system for measuring selected parameters of electrical signals having a predetermined frequency. In the preferred embodiment, the electrical signals are derived by relative movement between magnetic transducers and a magnetic medium having prerecorded data thereon.

However, one of the real advantages of the electrical measuring system is that it is operable independent of any specific mounting mechanism. For example, the electrical measuring system is able to test single-sided flexures, head-arm assemblies, read pulse trains, head stacks and media. FIG. 1 illustrates one embodiment wherein the magnetic medium is in the form of rotating discs 18 which have a predetermined space therebetween and which are adapted to have a "tree" assembly 20 inserted therebetween. The "tree" assembly 20 is formed of a support arm 32 having thin-film magnetic head slider assemblies which are located on the upper portion of the arm 32 and supported therefrom by means of flexures 24 and thin-film magnetic head slider assemblies 26 located on the lower side of support arm 32 which are supported by flexures 28. Relative movement is obtained between the magnetic transducers 22 and 26 by rotation of the magnetic medium 18 having prerecorded data thereon. The support arm 32 is movable radially relative to the rotating discs.

Although the preferred embodiment shows the heads 22 and 26 being maintained stationary but movable into and out of the disc by means of loading arm 32, the teachings of this invention would apply to a magnetic recording and reproducing system wherein the medium can be in any form, such as a magnetic tape which engages a magnetic head assembly. In use, any electrical signal derived by relative movement between the magnetic transducer and the magnetic medium can be measured utilizing the teachings of the present invention.

The loading arm 32 of the "tree" assembly 20 is moved into and out of operative relationship between discs 18 by means of an interface mechanism 36. The electrical signals received from the "tree" assembly 20 which comprise electrical signals, having a frequency within a known frequency range, from each of the individual thin-film magnetic head slider assemblies 22 and 26. The electrical signals are applied via a lead 40 to AND amplifier 41 to read circuit 42, the output of which is represented by output 48. Output 48 applies the read pulses as an input to the measuring system 50. Lead 40 also receives data signals received by write circuit 46 and amplifier 47.

The electrical signals received by the read amplifier 42 and decoded by decoder 43 are applied via lead 48 to a measuring system 50 which utilizes the teachings of the present invention. The output of the measuring system 50, which appears on output 52, is applied to a computer memory 54 which, in turn, applies the stored information via lead 56 to a CPU 58. In certain of the testing modes, the digital data is generated faster than the CPU can process the digital data. Thus, the data is stored in memory. Concurrently, the digital output signals from the measuring system 50 are applied via lead 60 to a printer or other output device 62 so that a direct printout or other display can be obtained of the digital representation.

Before a description is given of the preferred embodiment block diagram, an overview of the various modules will be explained.

In concept, a function reconstruction module is responsive to the input electrical signals having a frequency within a known frequency range to produce a digital representation of discrete sampled values of the input analog function. The uniqueness of the function reconstruction module resides in the fact that the sampling points are arbitrarily small phase intervals apart and the module does not require very high speed clocks or components to operate. For example, 1 nanosecond equivalent sampling point separations are derived by using a 1-megahertz clock. The mathematical principles underlying the approach are set forth hereinafter in the specification.

Figure 2:
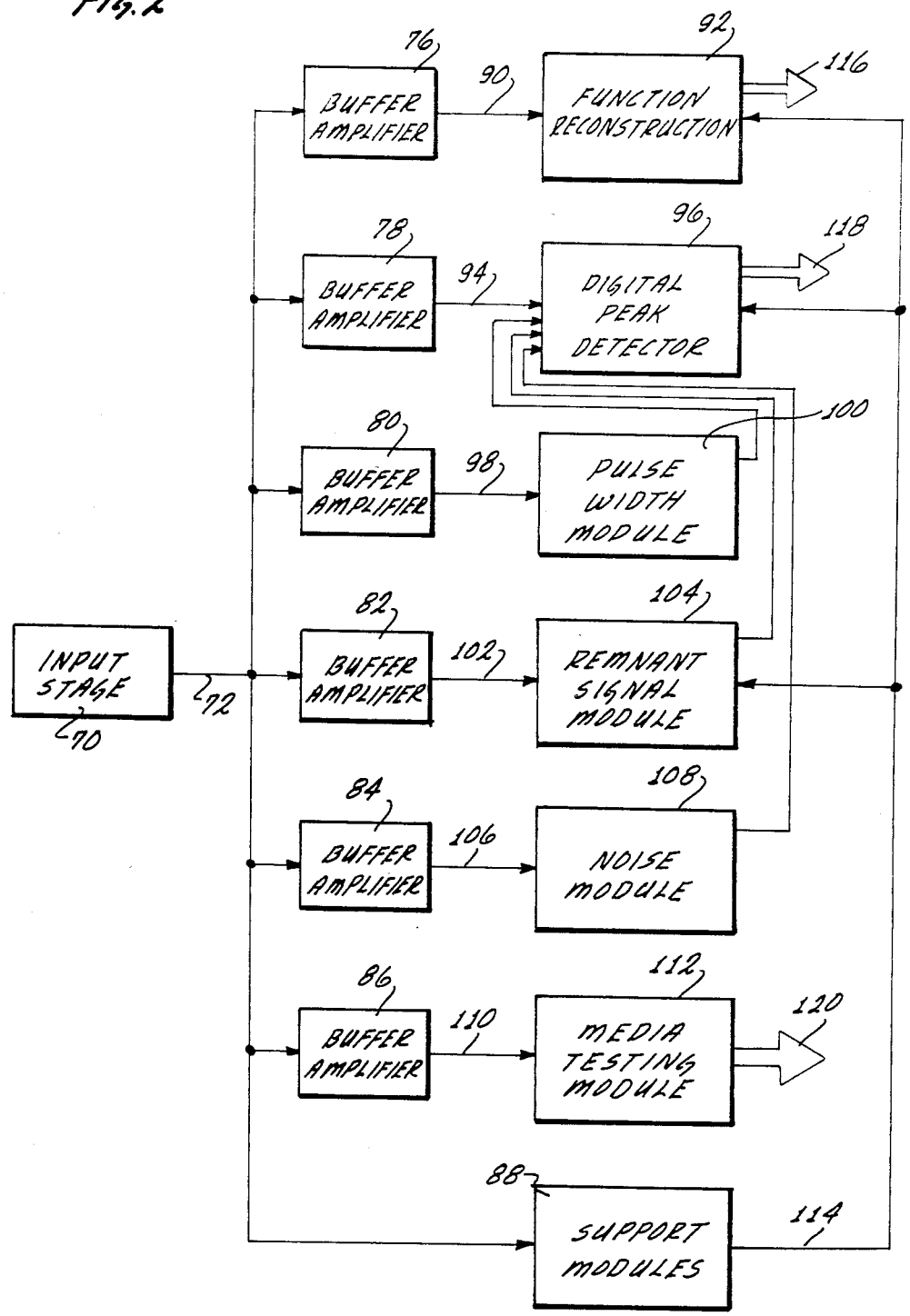
FIG. 2 is a block diagram representing basic modules for performing electrical signal measurement and the support module which electrically supports certain of the basic modules.
Figure 3:
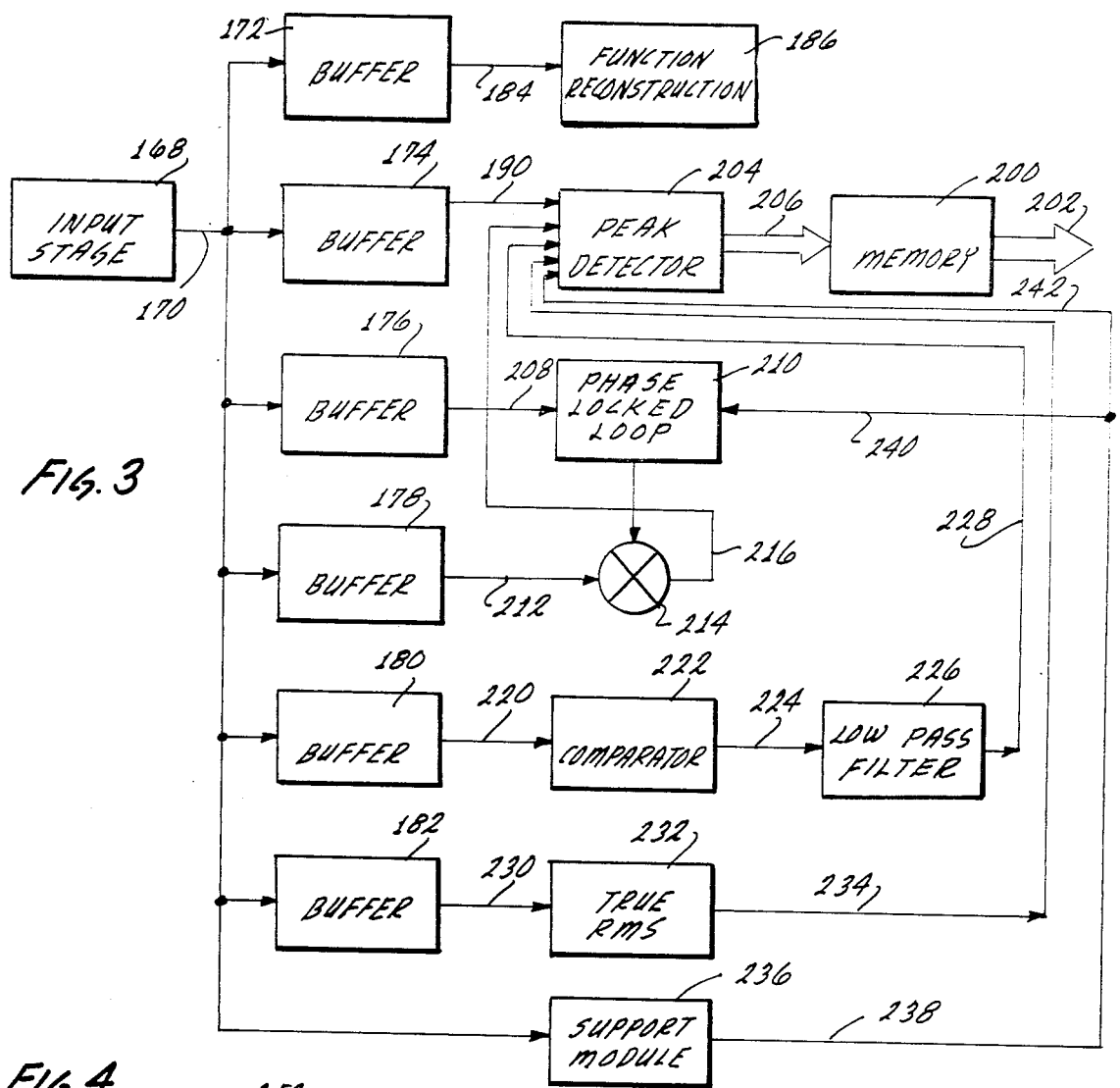
FIG. 3 is a block schematic diagram representing the five basic modules which comprise the electronic measuring system utilizing the teachings of the present invention.

The digital peak detector module functions to provide a digital representation of the selected parameters of the electrical signals to be measured. As illustrated in FIGS. 2 and 3, the function reconstruction module may be a separate module, and the digital peak detector can be a separate module.

Module 1: Amplitude and Deviations from Mean Value

In operation, the digital peak detector receives the electrical signals and produces a digital output signal which is representative of the instantaneous amplitude of the signal at a sampled point wherein the frequency of the signal is derived automatically from the input signal by means of a phase-locked loop. The sampled signals are generated at a rate of one-fourth of the incoming frequency. In the preferred embodiment, the incoming frequency is in the order of 1 to 15 megahertz and the sampling occurs at one-fourth of this frequency. The result is that the digital peak detecting means is capable of measuring changes in amplitude, which occur at a rate of one-fourth of the frequency of the incoming frequency. The measuring of changes in amplitude based upon a deviation from a mean amplitude can be done digitally by a digital computer after the signal has been digitized. The output of the digital peak detector is an 8-bit digital word corresponding to the last-sampled value of the electrical signals.

Module 2: Overwrite Signal for Producing Read-Over-Write Ratio

Module 2 operates on the basis that the magnetic recording medium retains a portion of the previously recorded signal even though the signal has been written over. The purpose of module 2 is to develop signals which relate strictly to the previously recorded, erased signal. If the remnant signal were completely erased, there would be no remnant signal, and the ratio would be infinity. However, in normal magnetic recording and reproducing systems, there is a remnant signal. The remnant signal results in noise in the read signal of the desired data; and, depending on the magnitude of the noise signal, errors can be introduced into the reproduced signals.

In conducting this test, the nominal frequency of the remnant signal is known and has an integer relationship with the frequency of the signal to be read back after the first signal is written over. The performance of the overwrite signal module is as follows:

(1) The frequency of the present signal is derived by means of a phase-locked loop;
(2) The output of the phase-locked loop serves as an input to a second phase-locked loop which, in turn, has a frequency divider that determines the proper division ratio in order to output a frequency which is equal to the frequency of the remnant signal, which remnant signal is known to have an integer relationship to the frequency of the second recorded signal;
(3) The output frequency is displaced by means of a single sideband modulation by 455 kilohertz.

Thus, the signal is comprised of a frequency which is a combination of the frequency of the remnant signal plus 455 kilohertz and that signal is used to detect the remnant signal by means of a heterodyne detector scheme. The output of the detector has a frequency of 455 kilohertz and the amplitude corresponding to the amplitude of the remnant signal. The signal which represents the amplitude of the remnant signal is applied to a digital peak detector, where it is converted into a digital representation as described above.

Module 3: Pulse Width of Electrical Signals

Module 3, which determines the pulse width of the electrical signals, functions in the following manner. The pulse width of the recorded signal can be evaluated at any one of 256 fractional values of its peak amplitude and the pulse width measurement is performed as follows:

(1) Incoming pulses are amplified to a constant preset level by an automatic amplifying means;
(2) The reference input of a comparator can be reset by a programmable input to any one of 256 fractional values of the fixed amplitude;
(3) The output of the comparator is a pulse of known amplitude and frequency but with a width corresponding to the width of the electrical signals at the reference level programmed into the comparator; and
(4) Since the frequency of the recovery signal is known, the frequency, or period, of the pulses appearing at the output of the comparator is known.

Thus, any periodic signal which appears at the output of the comparator consists of periodic signals of pulse trains of known amplitude having a known period but unknown pulse width. The pulse widths are determined by measuring the DC content of the pulse train and then numerically deriving the pulse width.

Based upon the Fourier expansion theorems, which are well known in the art, it is known that the information pertaining to the pulse width is contained in every term of the expansion and specifically in the DC or zero term. Hence, by determining the DC level of the generated pulse stream, the pulse widths can be deduced. The direct current level of the signal pulse train is obtained by passing the signals through the low-pass filter, as described above. The DC signals are then applied to a digital peak detector.

Module 4: Power Magnitude of the Noise Spectra Signals

Module 4, which determines the power magnitude of the noise spectra signals, operates as follows. The electrical noise signals are passed through a low-pass filter of a pass bandwidth corresponding to the noise bandwidth of the device under test. The band limited signal is then pseudo randomly sampled by means of a sample and hold circuit. The output signal of the sample and hold circuit is then applied to a well-known root-mean-square circuit to DC converter which develops a direct current voltage, in an RMS, which represents the power magnitude portion of the electrical signal which comprises the noise spectra signals. The direct current voltage is passed through a second low-pass filter which passes essentially the direct current voltage representing the power magnitude of the noise spectra signals. The direct current voltage is then applied to a digital peak detector.

In operation, the modules described above can generally be referred to as the main modules required for performing the above functions. The phase-locked loop modules, the modules for synthesizing frequencies for purposes of writing data on the magnetic media, and the like, can be deemed support modules.

The concept utilized in the digital peak detecting means modules will be explained as follows.

The operation of the digital peak detecting means, which produces the waveform of FIG. 6(c), is based upon read signals derived from a magnetic medium through magnetic transducers. The electrical signals are generated by writing repetitive, predetermined patterns of more than six bits onto the magnetic medium. The patterned structure recorded on the medium can be any binary pattern of six or more bits. The pattern can be written at any frequency from 1 kilohertz to 25 megahertz. The separation between the sampling points (in time) will be in the order of 1:128 of the observation period. The observation period may have a duration of between 1 and N bits. The N corresponds to the length or the periodicity of the repetitive pattern. For example, if the pattern were written at 10 megahertz and the observation period were 1 bit, the corresponding sampling interval $\Delta T$ will be given by the following equation:

$$T = \frac{1/10^7}{128} = 0.78 \times 10^{-9} \, SEC$$

The sampling intervals may be shortened to less than one nanosecond. In order to avoid the use of sampling circuits and signals which would have to function at a rate of one gigahertz or more, the following approach has been developed to derive these signals provided the patterns are periodic. Assume the following two periodic functions, $u_1(t)$ and $u_2(t)$:

$$u_1(t) = \cos(w_1 t)$$

$$u_2(t) = \cos(w_2 t)$$

Further assume that the radial frequencies $w_1$ and $w_2$ relate via the following equation:

$$w_1/w_2 = N_1/N_2$$

wherein $N_1$ and $N_2$ are integers. Further assume that there exists no integer $K > 1$ such that:

$$K \cdot \frac{N_1}{N_2'} = \frac{N_1}{N_2'} \quad N_1' < N_1 \, N_1, \, N_2 \text{ are integers}$$
$$N_2' < N_2$$

Assuming further that at the time $t = t_0$ the functions $u_1(t_0)$ and $u_2(t_0)$ are in phase such that the phase between the two functions is given by the following equation:

$$\phi(t_0) = 0$$

In general, the phase functions are given by the following equations:

$$\phi(t) = w_1 t - w_2 t$$
$$= (w_1 - w_2)t$$

with $\phi(t_0) = 0$ by definition. Since $u_1(t)$ and $u_2$ are given to be periodic, $\phi(t)$ must also be periodic. The period of $\phi(t)$ is given by $T_0$ wherein:

$$T_0 = \frac{2\pi}{w_1 - w_2}$$

from $$\frac{w_1}{w_2} = \frac{N_1}{N_2}$$

one gets $$w_1 = \frac{N_1}{N_2} w_2$$

and thus $$w_1 - w_2 = w_2 \frac{N_1}{N_2} - w_2 = w_2 \left( \frac{N_1}{N_2} - 1 \right)$$
$$= w_2 \left( \frac{N_1 - N_2}{N_2} \right)$$

Finally, $$T_0 = \frac{2 \cdot \pi \cdot N_2}{w_2(N_1 - N_2)}$$

Consider the case where $N_1$ and $N_2$ were chosen such that $$N_1 - N_2 = 1$$

Then $$T_0 = \frac{2\pi N_2}{w_2}$$

Using the same assumption, let the period of $u_2(t)$ be $T_2$. Then $$T_2 = 2\pi/w_2$$

and hence $$T_0 = N_2 T_2$$

In the same manner, the period of $u_1(t)$ is given by $T_1$. Where $$T_1 = \frac{2\pi}{w_1} = \frac{2\pi N_2}{N_1 w_2}$$

$$= \frac{N_2 T_2}{N_1}$$

$$= \frac{T_0}{N_1}$$

Recalling that $N_1 - N_2 = 1$ one gets $$T_1 = \frac{T_0}{N_1} = \frac{T_0}{1 + N_2}$$

or $$T_0 = T_1(1 + N_2)$$

Based on the above, the following observations are noted:

1. During the period $T_0$ the function $u_1(t)$ went through $N_2+1$ cycles;
2. During the same period the function $u_2(t)$ went through $N_2$ cycles;
3. At the end of the period $T_0$ the phase between $u_1(t)$ and $u_2(t)$ is the same as at the beginning of the period $T_0$; and
4. With each cycle of $u_1(t)$ during the period $T_0$, the phase $\Delta(t)$ between $u_1(t)$ and $u_2(t)$ advanced by $2\pi/N_2$ radians.

Point 4 is the key observation upon which the method rests. Namely, by observing the functions $0(t)$, $u_1(t)$ and $u_2(t)$ arbitrarily small increments in relative time can be generated.

Consider the case where $u_1(t)$ is the input function and $u_2(t)$ is the sampling function. Then the first zero crossing of $u_2(t)$ after the event $0(t)=0$, corresponds to the point on the function $u_2(t)$:

$$u_2(0+\Delta T)$$

where $$\Delta T = T_2/N_2$$

The second zero crossing corresponds to $$u_2(0+2\Delta T)$$

and the other zero crossing can be represented by similar equations. Because of the periodicity assumption $$u_1(t) = u_1(t + K T_1)$$

where $K = 1, 2, 3 \ldots$, for the case where:

$$K = 1 + N_2$$

one gets $$u_1(t) = u_1(t + T_0)$$

Hence, every $T_0$ seconds the same sample can be obtained. In this way the following important criteria have been obtained.

1. The sample spacing $\Delta T$ can be made arbitrarily small; and
2. The sampling rate (the rate at which the system has to process new samples) can be made arbitrarily low. It should be understood that because of the periodicity assumption placed on the pattern, the method does not violate Shannon's Theorem.

Based on the above concept, the instantaneous amplitudes of the electrical signals can be sampled and the so-produced sampled data can be converted into digital representations as described hereinafter.

FIG. 2 illustrates, by means of a block diagram, the overall system architecture for performing a wide variety of measuring of selected parameters of electrical signals having a frequency within a known frequency range. As discussed in connection with FIG. 1, the electrical signals are derived by relative movement between magnetic transducers and a magnetic medium having prerecorded data thereon. The measured selected parameters are represented by digital output signals which are applied as an output to either a computer memory or a printer/output device as discussed in connection with FIG. 1. In the embodiment illustrated in FIG. 2, the electrical signals having a frequency within a known frequency range are applied to an input means 70. In the preferred embodiment, the input means includes an automatic amplifying means for receiving the electrical signals and for selectively amplifying electrical signals to a preselected amplitude level. The preselected amplitude level electrical signals appears on output 70 and are applied concurrently to a plurality of buffer amplifiers designated as buffer amplifiers 76, 78, 80, 82, 84 and 86. Buffer amplifier 76 applies its output signal via lead 90 to a function reconstruction means 92 which is capable of performing a wide variety of functions, such as a sampling means for periodically sampling, at closely spaced intervals, the amplitude of the preselected amplitude level electrical signals and for applying the same to a digital peak detecting means for producing a digital representation of the sample of instantaneous amplitude in the last-sampled electrical signal. In the preferred embodiment, the sampling means operates at a frequency so as to sample the preselected amplitude level signals at a sampling frequency less than the frequency of the input electrical signals.

The second buffer amplifier 78 applies the preselected amplitude level electrical signals on its output 94 to a digital peak detecting means 96. The digital peak detecting means 96 includes means for sequentially producing a digital representation of a plurality of processed electrical signals and for producing digital representation for each processed electrical signal applied thereto, representing the selected parameters of the electrical signals. The digital peak detecting means includes means for sampling the signals applied thereto at a frequency which is less than the frequency of the input electrical signals. The output of the digital peak detector is a digital output signal which is applied to the memory or printer/output device, as discussed in connection with FIG. 1.

The measuring means further includes a buffer amplifier 80 which applies the preselected amplitude level electrical signals to a pulse width means 100. The pulse width means 100 is adapted to produce a train of known-amplitude pulses having a known period and a variable pulse width which is a function of the width of the pulse widths of the preselected amplitude level electrical signals and which derives therefrom an integrated voltage signal representative thereof and applies the same to the digital peak detecting means to produce a digital representation of the average pulse widths.

Buffer amplifier 82 applies a preselected electrical amplitude signal by its output 102 to a remnant signal means 104. The remnant signal means 104 is adapted to produce an overwrite signal representing the amplitude of a remnant signal having a frequency within a known frequency range and which is present in the preselected amplitude level electrical signals. The remnant signal frequency can either be less or more than the frequency of the electrical signals. Generally, the remnant signal frequency is within a known frequency range. The overwrite signal is applied to the digital peak detecting means for producing a digital output signal representative of the magnitude of the overwrite signal.

Buffer amplifier 84 applies the preselected amplitude level electrical signals via its output 106 to a noise spectra signal means which is adapted for producing a direct current voltage signal representative of the power of the noise spectra signals which form part of the preselected amplitude level electrical signals. The bandwidth of the band-pass filter is selected to correspond to the noise bandwidth of the electrical signal, and the band pass limited noise signal is sampled by a sample and hold circuit, the output of which is applied to a RMS-to DC converter to produce a direct current voltage signal The direct current voltage signal is then applied to the peak detecting means for producing a digital representation of the power of the noise spectra signals.

Buffer amplifier 86 applies the preselected amplitude level electrical signals via output 110 to a media testing module 112. The media testing module is capable of producing a digital output count representing the number of missing or extra pulses detected while reading a prerecorded media segment.

In addition, the preselected amplitude level electrical signals which appear on output 72 are applied to a support module 88, the output of which is applied via lead 114 to the function reconstruction module 92, to the digital peak detecting means 96, and to the remnant signal module 104. The support modules typically include a synthesizer function generator for generating signals of a known frequency and a phase-locked loop is used to derive the clock pulses from an encoded prerecorded signal. Both the synthesizer and the phase-locked loop outputs are applied to the modules shown in FIG. 2 via lead 114.

It is envisioned that a number of other circuits could be utilized, such as Fourier's signal analysis circuitry and the like, for measuring other parameters of the electrical signals. Typically, the preselected amplitude level signals would be applied via buffer amplifier to the specific testing means so that the testing means could produce output signals in terms of an analog signal, which then, in turn, are applied to the digital peak detecting means which produces a digital output signal representative of the direct current voltage representing the measured parameters.

As illustrated in FIG. 2, the function reconstruction means 92 generates digital output signals which are applied via the bus 116 to the digital memory. Likewise, the digital peak detecting means 96 produces digital output signals which are applied via bus 118 to the memory. Also, the media testing means 112 generates digital output signals which are applied via a bus 120 to the memory.

FIG. 3 illustrates, by means of a block diagram, the overall system architecture for the preferred embodiment of a measuring system utilizing the teachings of this invention. The measuring system includes an input means, which comprises an input stage 168 which is adapted to receive the electrical signals, having a frequency which is within a known frequency range, which are derived from relative movement between the magnetic transducers and a magnetic medium having prerecorded data thereon. The input stage 168 includes an automatic amplifying means for receiving the electrical signals and for selectively amplifying the electrical signals to a preselected amplitude level. The preselected amplitude level electrical signals appear on output 170. The output on lead 170 is divided into "n" components which are applied to a plurality of buffer amplifiers, such as buffer amplifiers 172, 174, 176, 178, 180 and 182.

The output of the buffer amplifier 172 is applied via lead 184 to a function reconstruction module 186. The function reconstruction module includes means for sampling at closely spaced intervals the instantaneous amplitude of te preselected amplitude level electrical signals and for producing an output signal representative of the sampled instantaneous amplitude of he last-sampled preselected amplitude level electrical signals. The output of the function reconstruction means 186 is applied via a bus 188 to the memory 200 which, in turn, is capable of delivering the data therefrom via bus 202 to a CPU.

The output of buffer amplifier 174 is applied via lead 186 to a digital peak detector 204. The digital peak detector 204 produces a digital representation of the peaks of the signal envelope amplitudes on bus 206 which applies the same to the memory 200.

Buffer amplifiers 176 and 178 function as a means operatively coupled to the input stage 168 via output 170. The buffer amplifer 176 has an output signal which is applied via lead 208 to a first phase-locked loop 210 that includes means for deriving the frequency of the preselected amplitude level electrical signals. The buffer amplifier 178 produces an output signal on lead 212 that is applied to a heterodyne circuit 214 which includes a frequency dividing means and a second phase-locked loop means which are operatively coupled to the first phase-locked loop means 210. The output of the frequency dividing means is applied as an input to the second phase-locked loop means within the heterodyne means 214, the output of which appears on output 216. The output from heterodyne 214 appearing on output 216 is an analog signal of the amplitude of a remnant signal having a frequency which is present in the preselected amplitude level electrical signals received from the input stage 168. The frequency of the remnant signal is usually a known integer of the frequency of the present signal being tested. The heterodyne 214 has an output which is applied via lead 216 as an overwrite signal which represents the remnant signal amplitude. The overwrite signal on lead 216, which represents the amplitude of the remnant signal, is applied as an input to the digital peak detector 204, which is responsive thereto for producing a digital output signal appearing on bus 206 which is representative of the magnitude of the overwrite signal. The digital signal on bus 206 is applied to and stored in memory 206 for further processing by a computer via bus 202.

The buffer amplifier 180 is operatively coupled to the input stage 168 and receives the preselected amplitude level electrical signals over output 170. The buffer amplifier 180 applies the preselected amplitude level electrical signals via its output 220 to a programmable comparator 222. The programmable comparator 222 includes a reference voltage level which is capable of being programmed to a selected one of a plurality of reference voltage levels representing a percentage of the preselected amplitude levels. The programmable comparator 222 is responsive to the preselected amplitude level electrical signals applied thereto via lead 220 and to the selected reference voltage level of the plurality of pre-established reference voltage levels applied to comparator 222 to produce an output pulse on output 224. The output pulse on output 224 produced by the programmed comparator 222 has a known amplitude which is determined by the precision output stage of the programmable comparator. The pulse width of the ouput pulse of the comparator 222 is determined by the width of the preselected amplitude level electrical signals at the known amplitude of the selected reference voltage level. The output from the comparator 222 is a train of known amplitude pulses having a known period and a variable pulse width which are determined by the pulse widths of the electrical signals at the selected reference voltage level. The programmed comparator 222 output 224 applies the train of pulses to a low-pass filter 226 to produce an integrated voltage signal representative of the direct current content of the train of pulses. The output of the low-pass filter 226 is an integrated voltage signal which is applied via lead 228 to the digital peak detector 204. The digital peak detector 204 digitizes the integrated voltage signal and produces a digital output on bus 206 which is representative of the average pulse widths of the electrical signals.

The buffer amplifier 182 applies the electrical signals via output 230 to a true RMS circuit 232 which develops a voltage signal representative of the noise spectra power of the input signal. The output of the true RMS circuit 232 is applied via lead 234 to the digital peak detector 90 which produces a digital signal representative of the noise spectra signals in the electrical signals.

Figure 4:
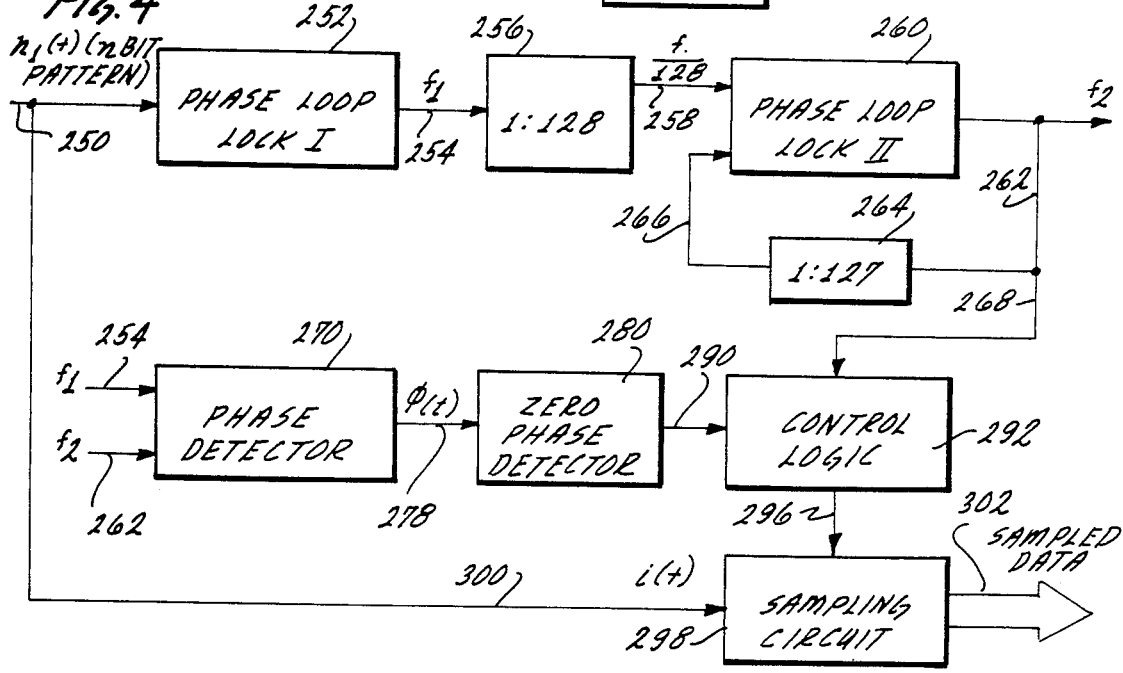
FIG. 4 is a block diagram of the first means for generating the sampling pulses of the amplitudes of the pulses of the electrical signals at the sampling instant, which system is incorporated into the functional reconstruction means.

FIG. 4 illustrates the function of the sampling means being incorporated into the function reconstruction means for sampling of the amplitude of the electrical signals at closely spaced intervals. As discussed above, the instantaneous and peak amplitudes of the electrical signals are digitized and utilized as an input to a computer which calculates various data therefrom, such as peak shifts, assymetries and the like. Thus, the block diagram of FIG. 4 discloses conceptually the steps of the method by which the function reconstruction means produces clocely spaced sampling pulses. The preselected amplitude level electrical signals have a fixed frequency signal $f_d$ which has three properties: (1) $f_d$ can be derived or retrieved from the read-back encoded signal; (2) $f_d$ will have a frequency which is a multiple of the source data rate: and (3) $f_d$ has a fixed phase relationship to the encoded read-back signal. Thus, the preselected amplitude level electrical signals are applied via input 250 to a phase-locked loop I 252 to retrieve a "pilot tone." The output or "pilot tone" output of phase-locked loop I 252 appears on output 254 and can be used to generate several signals which have a fixed phase relationship to the read-back signals. In the embodiment of FIG. 4, the output signal is applied to a 1-to-128 frequency divider illustrated as 256. The output from the frequency divider 256 appearing on output 258 is the derived frequency applied to the phase-locked loop 252 divided by 128. The output of the frequency divider 256, which appears on output 258, is applied as one of two inputs to a phase-locked loop II 260. The output of the phase-locked loop II 260 appears on output 262, which is applied to a second frequency divider 264 which divides the frequency by 127, producing a frequency signal 266, which appears at the output of the frequency divider 264. The output 266 is applied as a second input to the phase-locked loop II 260. The output 262 is also applied via lead 268 as one of two inputs to a control logic 292. A parallel circuit includes a phase detector 270 having two inputs which are adapted to receive on one input thereof the signal that appears on output 254, identified as $f_1$. The signal from the phase-locked loop II 260 appears on the other input to phase detector 270 and is identified as $f_2$. The output of the phase detector 270 appears on output 278 and is a signal which varies linearly as a function of time. The signal appearing on output 278 is applied to a zero phase detector 280, the output of which appears on output 290 and which is applied to the second input of the control logic 292. The control logic 292 is responsive to the signals developed from phase-locked loop II 260 and to the signals from the zero phase detector 290 to apply a signal on lead 296 to a sampling circuit 298. The other input to the sampling circuit is the original preselected amplitude level electrical signals that appear on input 300. The output of the sampling circuit appears on bus 302 and is representative of the instantaneous amplitude of the electrical signal which has been sampled at a frequency determined by the frequency dividers 256 and 264 and which is less than the frequency of the electrical signals. The output 302 is applied to the digital peak detector in the manner described in connection with digital peak detector 204 in FIG. 3.

FIG. 5 illustrates the preferred embodiment of the system for measuring selected parameters of electrical signals having a frequency within a known frequency range. As stated above, in the preferred embodiment the electrical signals are derived by relative movement between magnetic transducers and a magnetic medium having prerecorded data thereon and wherein the electrical signals to be measured are essentially outputs from the read amplifiers which are responsive to the signals received from the magnetic heads.

FIG. 5 is a specific embodiment of the block diagram of FIG. 3. The output of the read amplifier appears across a pair of inputs 320 and 322 and are applied through voltage dividing resistors 324 and 326 to an automatically controlled and digitally regulated amplifying means 330. The automatic amplifying means 330 is adapted to receive the electrical signals and selectively amplifies the electrical signals to a preselected amplitude level. The amplified signals are applied via an RC network comprising capacitor 332 and resistor 334 as an input to a low-pass filter 336. The output of the low-pass filter 336 is applied across a voltage dividing resistor 338 to "n" buffer amplifiers, of which buffer amplifiers 342, 344, 346, 348, 350, 352 and 354 are typical. These buffer amplifiers are similar to the buffer amplifier of FIG. 3.

The first means of the measuring system includes a digital peak detector 360 which is responsive to the peak amplitudes of the preselected amplitude level electrical signals and produces a digital representation of the peak amplitude and of sampled instantaneous amplitude sampled at closely spaced intervals of the last-sampled electrical signal. If desired, a separate means may be added as the functional reconstruction means described in connection with FIG. 3. The operation of the digital peak detecting means is illustrated and explained in connection with the description of FIG. 4 and FIG. 7 hereof. The output of the digital peak detector 360 is applied to a digital memory 362 which applies its output to a bus 364.

The second means, which includes buffer amplifiers 344 and 346, includes a first phase-locked loop means 370, a frequency dividing means 372, and a second phase-locked loop 374 which operates in the same manner as phase-locked loop 210 and heterodyne circuit 214 of FIG. 3. The phase-locked loop 374 applies its output signal to a summing terminal 376 and applies the same signal to a frequency dividing means 380, the output of which is fed back as a second input to the phase-locked loop 374. In addition, an oscillator 380 having a predetermined frequency, which in the preferred embodiment is 455 kilohertz, is applied as a second input to the summing point 376. In the preferred embodiment, the circuit utilizes a ceramic filter 398 Model CFR 455B sold by Murata Erie North America, Inc. The oscillator 380 functions in cooperation with the phase-locked loop as a heterodyne signal demodulator to produce an output signal which appears at output 389. The buffer amplifier 346 has electrical signals appearing at lead 390 and applies the same to a second summing point 392, which receives the frequency signal on lead 394 to produce an output signal representing the amplitude of the remnant signal which appears on output 396. The output signal appearing at 396 is the overwrite signal which is developed from the remnant signal. The remnant signal is passed through a band-pass filter 398 and a second buffer amplifier 400 to produce the output signal 402 in the form of a voltage level signal which is applied to the digital peak detector 360. The digital peak detector 360 produces a digital output signal which represents the magnitude of the overwrite signal.

The third means includes the buffer amplifier 348 and a programmable comparator 408 which operates in the same manner as comparator 222 of FIG. 3. The output of the programmable comparator 408 is applied to a limiter 412 and then to a low-pass filter 414 to produce an integrated voltage signal representative of the direct current content of the train of pulses. The output from the low-pass filter 414 which appears on output 416 is applied to the digital peak detector 360 for digitizing. The digital peak detector 360 produces a digital representation of the average pulse widths derived from the direct current content of the original electrical pulses.

The measuring system includes a fourth means which includes the buffer amplifier 350, a low-pass filter 420, a true RMS square voltage circuit 422, and a low-pass filter 424 to develop a direct current voltage signal which is representative of the magnitude of the noise spectra signals in the same manner as the RMS circuit 232 in FIG. 3. The output from the low-pass filter 424 appears on output 426, and output 426 applies the same as an input to the digital peak detector 360. The digital peak detector 360 is responsive to the direct current voltage for producing a digital representation of the magnitude of the noise spectra signals.

FIG. 5 also illustrates a dashed buffer amplifier 352 and a dashed buffer amplifier 354, each of which is operatively coupled to receive the electrical signals from the input means including the automatic amplifying means 330. It is possible to add other buffer amplifiers to provide additional circuitry for measuring selected parameters of the electrical signals. Other parameters of the electrical signals can be further measured using appropriate circuitry to develop digital output signals. For example, a specific circuit 440 adapted to measure a desired signal parameter may be used and a digital output signal is produced which appears on bus 442.

The buffer amplifier 354 can be applied as an input to media signal processing circuitry 450, which includes a means for detecting the number of missing or extra pulses, the output of which appears on bus 452. Circuit means capable of being used as the means for measuring peak shift and signal assymetry 440 and means for detecting the number of missing or extra pulses 450 are well known in the art.

FIG. 6(a) illustrates, in a waveform format, the type of signal processing that is performed by the various means. The waveform of FIG. 6(b) represents the idealized amplified electrical signals as they are generated by the magnetic transducer in response to relative movement between the transducer and a magnetic medium. The square waves of FIG. 6(a) basically represent ideal transitions of change in flux in the medium detected by the magnetic head wherein the leading and trailing edges thereof represent flux reversals of the magnetic flux produced by the transducing actions between the magnetic head and the disc. The leading edge of the pulses in FIG. 6(a) each generate a positive pulse as represented by the pulses of the waveform of FIG. 6(b). The trailing edge of the first pulse generates a negative pulse as represented by the negative-going pulse of the waveform of FIG. 6(b). Each subsequent reproduced signal, which is in the form of a square wave as shown by the waveform of FIG. 6(a), likewise generates positive- and negative-going electrical signals.

The waveform illustrated in FIG. 6(b) depicts the electrical signals at a known frequency after they have been automatically amplified to a preselected amplitude and represents the preselected amplitude level electrical signals at the known frequency. A dashed line 454 represents the peak amplitude of the positive-going pulses. Line 456 represents a selected reference voltage level which is applied to the comparator of the third means, as illustrated, for example, by input 410 to the programmable comparator 408 in FIG. 5.

As illustrated by waveform of FIG. 6(b), the selected reference voltage level 456 intersects both the leading and trailing edges of only the positive-going pulses and does not intersect the leading or trailing edges of the negative-going portion of the pulses.

Referring now to the waveform of FIG. 6(c), the digital pulses represented by this waveform are electrical signals which are produced by the function reconstruction means and are converted to produce a digital representation of the sampled instantaneous amplitude of the last-sampled electrical signal. The electrical signals are sampled at closely spaced intervals at a frequency which is at a frequency less than the frequency of the electrical signals. The result is an electrical signal which has very short duration pulses but an amplitude which is determined by the amplitude of the electrical signal at the precise time that the sampling occurs. The result is a plurality of spaced electrical pulses having amplitudes determined by the amplitude of the electrical signal at the time of sampling. When the amplitude signal is applied to the digital peak detector, the output thereof is a digital signal in the form of a multibit digital code which is produced by the digital peak detecting means. The digital signal is a digital representation of the sampled instantaneous amplitude of the last-sampled electrical signal.

The waveform of FIG. 6(c) is a representation of the sampled instantaneous amplitudes of the electrical signals which are applied to the digital peak detetor to generate digital representations thereof. As noted above, the digital peak detector is utilized as a digitizing means for voltage signals from the other functions is unique and provides a means for generating the early digitizing of voltage signals into digital signals for further processing.

The waveform of FIG. 6(d) is a series of output pulses having a known amplitude and a known period but a variable pulse width which is determined by the pulse width of the electrical signal illustrated in the waveform of FIG. 6(b). Specifically, the reference voltage level 456 of the comparator, as described above, establishes the known reference level, and the point where the voltage level of the leading edge and trailing edge of the positive-going portion of the electrical signal responds to the voltage set by the voltage set by the comparator producing an output pulse as illustrated in the waveform of FIG. 6(d). Thus, every positive-going portion of the electrical signals generate output pulses having a known amplitude and period but having a variable pulse width wherein the variable pulse width is a function of the width of the electrical signals at the predetermined voltage level established by the set reference level of the comparator.

FIG. 7 illustrates one embodiment of a digital peak detecting means which can be utilized as a digital peak detector in the electrical measuring circuit of the present invention. In the digital peak detecting means of FIG. 7, the output from the read amplifier includes both the electrical signals which are representative of the reproduced data, which is essentially an input signal which appears on input 600. The input signal on lead 600 is the electrical signal. The electrical signal has a frequency which is within a known frequency range which is applied via lead 602 to a phase-locked loop means 604 for deriving the frequency of the electrical signals. The output of the phase-locked loop 606, called VCO pulses, is applied via lead 606 to a frequency dividing means 607. The electrical signals are applied to a voltage dividing network 700 to produce an analog input signal on input 702.

The digital peak detecting means includes a frequency dividing means 607 which produces control signals having a frequency which is a preselected fractional integer of the frequency of the carrier signal appearing on lead 600. In the preferred embodiment, the frequency dividing means is a 1:4 ratio frequency division. The control signals are applied to a pulse shaping means shown generally as 611 which produces clock pulses wherein the predetermined amplitude and the width of the pulses are controlled. The clock pulses appear on output 614 and are applied as an input to a pulse scaling means shown generaly as 615.

The pulse scaling means 615 is operatively coupled to the pulse shaping means 611 and receives the clock pulses and counts the same to generate a first pulse count signal which is an upscale signal or a second pulse count signal which is a downscale signal.

An event-registering flip-flop 710 and the pulse scaling means 615 function as a count enable which is operatively connected to and responsive to the output of a comparator 706.

The analog signal, which is to be digitized, is derived from the electrical signals by network 700 and appears on lead 701. Lead 701 applies the analog signal to one input 702 of a comparator 706. The comparator 706 has a second input 704 which is adapted to have sequentially applied thereto a selected one of a plurality of programmed reference voltage levels generated by the counting means 720. The output 708 of the comparator 706 is operatively coupled to the event registering means 710 via lead 708.

A digital counting means shown generally as 720 is responsive to the first and second pulse count signals 684 and 686 received from the pulse scaling means 615 and to clock pulses. The digital counting means 726 produces discrete digital output signals which are applied to a latch register 742 and to a digital-to-analog converter 734. The digital-to-analog converter 734 is operatively coupled to the second input 704 of the comparator 706.

The digital counting means 720 is enabled as long as the input voltage to the comparator 706 is of a larger magnitude than the analog output voltage from the output of the digital-to-analog converter 734. Once this condition is not satisfied, the digital counting means 720 is stopped. The digital counting means 720 retains the value corresponding to the last-detected peak.

The tracking feature is accomplished by using the up/down counter 615. Once a peak has been detected, the counting direction of the digital counting means 720 is reversed. The digital counting means 720 is then decremented until the input voltage is of greater magnitude than the digital-to-analog converter 734 output.

The digital peak detecting means of FIG. 7 has the following special features:

(1) The clock driving the digital counting means 720 is phase locked to the input signal. Hence, the counting process is synchronous with respect to the input signal. The digital peak detector then, in essence, becomes a synchronous demodulator.

(2) The frequency response of the digital peak detector responds to counter clock pulses having a frequency which is ¼ of the carrier input frequency. The upper limit of operation is approximately 30 megahertz. The counter clock maximum frequency is then 7.5 megahertz. This ratio was chosen because the settling time of the digital-to-analog converter 734 used in this embodiment is 135 nanoseconds corresponding to a clocking frequency of 7.407 megahertz. The digital peak detector can thus change by one count for every four cycles of the input signal. The maximum modulating frequency (or envelope), $f_m$, which can be tracked by the peak detector, is given by $f_m$. Where $$f_m = \frac{f_{in}}{4(1 + 127\, m)}$$

Where
$f_m$ = modulating frequency
$f_{in}$ = input frequency
m = index of modulation:

$$0 \leq m \leq 1.$$

The formula derived above can be explained as follows:

(1) For every four input cycles, the counter can be changed by one count;

(2) Since the digital-to-analog converter is an eight-bit device (seven information bits and one sign bit), the total amplitude can be resolved to 128 states. Given that the index of modulation is:

$$0 \leq m \leq 1$$

by definition, one gets for:

$$m = 1$$

that 128 steps are required to move the digital-to-analog converter output from its maximum value to its minimum value. Expressed in terms of input frequency cycles, this process will require 4 periods of input signal.

In summary, the implementation of the digital peak detector described above exhibits the following advantages:
 (i) low cost;
 (ii) reasonably high bandwidth;
 (iii) operation with high carrier rates (up to 30 megahertz); and
 (iv) fully tracking.

The digital peak detecting means illustrated in FIG. 7 can also be utilized for receiving analog signals applied from the other measuring circuits and to digitize the signals produced by the individual modules as a digital output signal which can then be stored in a memory and be subject to further processing by a digital computer.

Although the preferred embodiment of the apparatus and method described herein relates to electrical signals of a frequency within a known frequency range derived from magnetic recording, the same principles can be applied to any type of electrical signals having a frequency within a known frequency range wherein certain selected parameters thereof are desired. For example, by utilizing the teachings of the present invention the method and apparatus disclosed herein can be used as input data measuring at least one or more of the amplitude, read-over-write ratio, signal-to-noise ratio, and the pulse widths of the electrical signals.

What is claimed is:

1. An electrical measuring system for measuring selected parameters of electrical signals having a frequency within a known frequency range wherein said electrical signals are derived by relative movement between magnetic transducers and a magnetic medium having prerecorded data thereon and the measured selected parameters are represented by digital output signals, said system comprising
 input means including automatic amplifying means for receiving said electrical signals and for selectively amplifying said electrical signals to a preselected amplitude level;
 a digital peak detecting means for sequentially producing a digital representation of a plurality of processed electrical signals and for producing a digital representation of the peak value for each processed electrical signal applied thereto representing the selected parameters of the electrical signals, said digital peak detecting means including means for sampling the signals applied thereto at a frequency which is less than the frequency of the input electrical signals;
 a first means operatively coupled to said input means for receiving and applying said preselected amplitude level electrical signals to a function reconstruction means for producing a sample value function representative of the amplitude of the preselected amplitude level electrical signals at the sampling instant and for applying said peak detection signal to said digital peak detecting means for producing a digital representation of the peak amplitude of said sampled electrical signals;
 a second means operatively coupled to said input means for receiving said preselected amplitude level electrical signals and producing an overwrite signal representing the amplitude of a remnant signal having a frequency within a known frequency range which is present in the preselected amplitude level electrical signals and for applying the same to the digital peak detecting means for producing a digital output signal representative of the magnitude of the overwrite signal;
 a third means operatively coupled to said input means for receiving said preselected amplitude level electrical signals and producing therefrom a train of known amplitude pulses having a known period and a variable pulse width which is a function of the width of the pulse widths of the preselected amplitude level electrical signals and deriving therefrom an integrated voltage signal representative thereof and applying the same to the digital peak detecting means to produce a digital representation of the average pulse widths; and
 a fourth means operatively coupled to said input means for receiving said preselected amplitude electrical signals and producing a direct current voltage signal representative of the power of noise spectra signals within said preselected amplitude level electrical signals and applying the same to the digital peak detecting means for producing a digital representation of the power of said noise spectra signals.

2. The electrical measuring system of claim 1 further comprising
 a memory means operatively coupled to said digital peak detecting means for storing the digital signals; and
 a computer processing unit operatively coupled to said memory means for receiving and processing the digital signals to produce digital signals representing the amplitude, overwrite ratio, signal-to-noise ratio and average width of the pulse train of the electrical signals.

3. The electrical measuring system of claim 1 wherein said second means includes
 a first phase-locked loop for determining the frequency of the electrical signals; and
 a heterodyne means including a frequency dividing means, a second phase-locked loop and a 455 kilohertz oscillator for producing the amplitude of the remnant signal.

4. The electrical measuring system of claim 1 wherein said third means includes
 a programmable comparator having two inputs and an output and which is adapted to have the analog input signal applied to one of its two inputs;
 a programmable source of a plurality of different reference level voltage signals which are applied to the other of the two inputs of said programmable comparator; and
 a low-pass filter which is responsive to output signals developed by said programmable comparator in response to the analog input signal and one of the reference level voltage signals being applied to the inputs thereof for producing the train of output pulses having a known amplitude and known period and variable pulse widths.

5. The electrical measuring circuit of claim 1 wherein said fourth means includes
a true Root Mean Square circuit which produces a DC voltage signal representative of the power of the noise spectra signals within said electrical signals.

6. The electrical measuring system of claim 2 wherein each of said first means, second means, third means, and fourth means are separate modules and said computer processing unit is programmable to produce first and second calibration signals for each module identified as said digital peak detecting means, said first means, said second means, said third means, said fourth means and and wherein the digital output signals poduced thereby are stored in the memory means and the computer processing unit calculates a calibration error for each module and that calibration error is used to automatically adjust the specific digital output signal received from a module for the calibration error of such module.

7. The electrical measuring system of claim 6 wherein said calibration process used by the computer processing unit is based on the equation $Y=AX+B$ wherein Y is the module output, A and B are calibration constants determined by the computer processing unit in response to the first and second calibration signals, and X is the parameter under measurement.

8. The electrical measuring system of claim 7 wherein the constants A and B are determined by two points $x_1$ and $x_2$ which are outputs of a calibration source.

9. A system for measuring selected parameters of electrical signals having a frequency within a known frequency range wherein said electrical signals are derived by relative movement between magnetic transducers and a magnetic medium having prerecorded data thereon comprising
input means including automatic amplifying means for receiving said electrical signals and for selectively amplifying said electrical signals to a preselected amplitude level;
a first means operatively coupled to said input means for receiving said preselected amplitude level electrical signals and wherein said first means includes a digital peak detecting means for producing digital representations of the peak amplitude of the preselected amplitude level electrical signals and sampled instantaneous amplitudes of the last-sampled electrical signal:
a second means operatively coupled to said input means for receiving said preselected amplitude level electrical signals and wherein said second means includes a first phase-locked loop means for deriving the frequency of said preselected amplitude level electrical signals, said second means further including a frequency dividing means and a second phase-locked loop means which are operatively coupled to the first phase-locked loop means wherein the output thereof is applied to the frequency dividing means and the output of the frequency dividing means is applied as an input to the second phase-locked loop means for determining the frequency of a remnant signal and applying the frequency signal to a heterodyne circuit for deriving an overwrite signal which is the amplitude of the remnant signal, said second means including means for applying the overwrite signal as an input to the digital peak detecting means for producing a digital output signal representative of the magnitude of the remnant signal;
a third means operatively coupled to said input means for receiving said preselected amplitude level electrical signals and wherein said third means further includes a programmable comparator capable of being programmed to a selected reference voltage level of a plurality of predetermined reference voltage levels and wherein the programmable comparator is responsive to the preselected amplitude level electrical signals and to a selected reference voltage level of the plurality of predetermined reference voltage levels to produce output pulses having a known amplitude determined by the selected reference voltage level and having pulse widths which are determined by the width of the preselected amplitude level electrical signals at the known amplitude of the selected reference voltage level to produce a train of known amplitude pulses having a known period and a variable pulse width wherein the width of each pulse is determined by the width of the preselected amplitude level electrical signals at the amplitude of the selected reference voltage level, said third means including means for applying the train of pulses to a low-pass filter to produce an integrated voltage signal representative of the direct current content of the train of pulses and for applying the integrated voltage signal to the digital peak detecting means to produce a digital representation of the average pulse widths of the electrical signals; and
a fourth means operatively coupled to said input means for receiving said preselected amplitude level electrical signals and wherein said fourth means further includes means for determining the power of noise spectra signals within said preselected amplitude level electrical signals and for producing a direct current voltage signal representative of the power of the noise spectra signals and applying the direct current voltage signal to the digital peak detecting means for producing a digital representation of the power of said noise spectra signals;
said digital peak detecting means being responsive to the processed electrical signals applied thereto from said first means, said second means, said third means and said fourth means to produce a plurality of digital output signals representative of at least one of the amplitude of the electrical signals, the amplitude of the remnant signal which is part of the electrical signals, the power of the noise spectra signals of the electrical signals, and the average pulse widths of the electrical signals produced by relative movement between the magnetic transducers and the magnetic medium having prerecorded data thereon.

10. The system of claim 9 wherein said second means includes an oscillator having a frequency of 455 kilohertz and further comprising
a band-pass filter which receives the heterodyne overwrite signal and applies the same as an input signal to the digital peak detecting means to produce the digital representation of the overwrite signal.

11. The system of claim 9 further comprising
means responsive to the preselected amplitude electrical signals for producing a digital output signal representing the phase shift and signal asymmetry of the electrical signals.

12. The system of claim 9 further comprising
means responsive to the preselected amplitude electrical signals for producing a digital output signal representing the number of missing pulses and extra pulses in the preselected amplitude level electrical signals.

13. A method for measuring selected parameters of electrical signals having a frequency within a known frequency range wherein the electrical signals are derived by relative movement between magnetic transducers and a magnetic medium having prerecorded data thereon and the measured selected parameters are represented by digital output signals, said method comprising selectively amplifying said electrical signals to a preselected amplitude level;

sampling said preselected amplitude level electrical signals with a first means including a digital peak detecting means for producing digital representations of the peak amplitude of the preselected amplitude level electrical signals and of the sampled instantaneous amplitude of the last-sampled electrical signal and wherein said digital peak detecting means includes means for periodically sampling, at closely spaced phase intervals, said preselected amplitude level electrical signals at a sampling frequency which is less than the frequency of the electrical signals;

deriving with a first phase-locked loop means the frequency of the preselected amplitude level electrical signals and applying the same to a second means which includes a frequency dividing means and a second phase-locked loop means for determining the frequency of a remnant signal and applying the frequency signal to a heterodyne circuit for deriving an overwrite signal which is the amplitude of the remnant signal and for applying the overwrite signal as an input to the digital peak detecting means for producing a digital output signal representative of the magnitude of the remnant signal;

applying the electrical signals to a third means which includes a programmable comparator capable of being programmed to a selected reference voltage level of a plurality of predetermined reference voltage levels and wherein the programmable comparator is responsive to the preselected amplitude level electrical signals and to a selected reference voltage level of the plurality of predetermined reference voltage levels to produce output pulses having a known amplitude and having pulse widths which are determined by the widths of the preselected amplitude level electrical signals at the known amplitude of the selected reference voltage level to produce a train of known amplitude pulses having a known period and a variable pulse width wherein the width of each pulse is determined by the widths of the preselected amplitude level electrical signals at the amplitude of the selected reference voltage signal, said third means including means for applying the train of pulses through a low-pass filter to produce integrated voltage signals representative of the direct current content of the train of pulses and for applying the integrated voltage signals to the digital peak detecting means to produce a digital representation of the average pulse widths of the electrical signals; and determining with a fourth means the power of noise spectra signals within the preselected amplitude level electrical signals and for producing a direct current voltage signal representative of the power of the noise spectra signals and applying the direct current voltage to a digital peak detecting means for producing a digital representation of the power of the noise spectra signals.

14. The method of claim 13 further comprising the step of
storing the digital signals produced by the digital peak detecting means in a memory.

15. The method of claim 14 further comprising the step of
performing calculations on the digital signals stored in the memory with a computer processing unit for producing selected data therefrom which is representative of at least one of the amplitude of the electrical signals, the signal-to-noise ratio, the read-over-write ratio, and the average pulse widths of the electrical signals.

16. The method of claim 15 further comprising the step of
calibrating each of the first means, second means, third means, and fourth means with a first and second calibration signal generated from a calibration source and calculating with a computer processing unit any variations of the received digital output signals relative to digital signals representative of the first and second calibration signals for calculating a calibration error.

17. The method of claim 16 further comprising the step of
adjusting each of the digital output signals received from the digital peak detecting means with a calibration error determined for each individual error of the first means, second means, third means, and fourth means, enabling the computer processing unit to utilize digital output signals which have been calibrated to reflect any calibration error.

* * * * *